United States Patent [19]

Smith et al.

[11] Patent Number: 4,576,676

[45] Date of Patent: Mar. 18, 1986

[54] THICK CRYSTALLINE FILMS ON FOREIGN SUBSTRATES

[75] Inventors: Henry I. Smith, Sudbury; Harry A. Atwater, Somerville; Michael W. Geis, Acton, all of Mass.

[73] Assignee: Massachusetts Institute of Technology, Cambridge, Mass.

[21] Appl. No.: 497,620

[22] Filed: May 24, 1983

[51] Int. Cl.[4] .............................................. C30B 1/08
[52] U.S. Cl. .............................. 156/603; 156/617 R; 156/DIG. 111; 427/86; 427/87
[58] Field of Search .................. 156/617 R, DIG. 80, 156/DIG. 102, 603, DIG. 111; 427/53.1, 86, 87; 29/576 T

[56] References Cited

U.S. PATENT DOCUMENTS

| | | | |
|---|---|---|---|
| 4,196,041 | 4/1980 | Baghdadi | 156/617 R |
| 4,323,417 | 4/1982 | Lam | 156/DIG. 80 |
| 4,383,883 | 5/1983 | Mizutani | 156/617 R |
| 4,473,433 | 9/1984 | Bosch et al. | 156/DIG. 80 |
| 4,479,846 | 10/1984 | Smith et al. | 156/603 |

FOREIGN PATENT DOCUMENTS 1225 1/1982 Japan .......................... 156/DIG. 80

OTHER PUBLICATIONS

J. Electrochem. Society, 12/82, pp. 21812–21818, Geis et al, v. 129, No. 12.
J. Electrochem. Society, 5/83, pp. 1178–1183, Geis et al, v. 130, No. 5.
Atwater, App. Phys. Lett. 41(8), 10/82, pp. 747, 748.

Primary Examiner—Hiram H. Bernstein
Attorney, Agent, or Firm—James E. Maslow; Thomas J. Engellenner

[57] ABSTRACT

To achieve a uniform texture, large crystalline grains or, in some cases, a single crystalline orientation in a thick ($>1$ μm) film on a foreign substrate, the film is formed so as to be thin ($<1$ μm) in a certain section. Zone-melting recrystallization is initiated in the thin section and then extended into the thick section. The method may employ planar constriction patterns of orientation filter patterns.

6 Claims, 2 Drawing Figures

THICK CRYSTALLINE FILMS ON FOREIGN SUBSTRATES

DESCRIPTION OF PRIOR ART

The U.S. Government has rights in this invention pursuant to Department of Energy Contract No. DE-ACO2-80ER13019.

TECHNICAL FIELD

This invention relates to semiconductor fabrication and, in general, to improving the quality of relatively thick crystalline films by providing a method for establishing large grains having specific crystallographic textures and orientations.

Much of the current interest in semiconductor electronic materials has focused on the fabrication of thin films on foreign substrates (e.g., silicon on sapphire and silicon on $SiO_2$), wherein the films have thicknesses of the order of 1 μm or less. However, two important areas of application of semiconductor films on foreign substrates require much thicker films. These areas are high-power integrated circuits and silicon photovoltaics. In the former application, films of 10 μm thickness, or a few tens of μm thickness, on insulating substrates such as $SiO_2$ are of interest. In the latter application, silicon photovoltaics, the need is for films of 30 μm thickness or greater, on both insulating and conducting substrates. (The two alternatives of insulating or conducting substrates correspond to different photovoltaic cell configurations.) In high power integrated circuits, single-crystal films, preferably of a well-defined crystallographic texture, are required. In the photovoltaic application, large-grain films are essential, and single-crystal films of a predetermined orientation would be highly desirable, if they could be produced by a low-cost, mass production process.

In recent years, numerous investigators have produced large-grain polycrystalline thin films of Si on $SiO_2$ by melting fine-grained polycrystalline Si using a laser, a strip-heater, or a bright lamp, and then allowing the melt to resolidify. The technique which has been most effective to date involves forming an elongated molten zone and scanning this zone across a film which is confined between a substrate and an encapsulation layer (see, for example, M. W. Geis, H. I. Smith, et al. "Zone Melting Recrystallization of Si Films with a Moveable Strip Heater Oven", J. Electrochem, Soc. 129, 2812 (1982)). This technique, called zone-melting recrystallization (ZMR), when applied to Si films ½ to 1 μm thick, yields films with (100) texture (i.e., (100) crystallographic planes are substantially parallel to the substrate surface). Furthermore, grains with (100) texture and a <100> crystallographic direction within about ±25° of the zone-motion direction tend to predominate over grains having other orientations by occluding them during the solidification process. This, in turn, leads to very large grains, about 1 mm wide, extending along the scan direction. However, when the Si film thickness exceeds about 5 μm, and especially above 20 μm, the pre-dominance of (100) texture is no longer observed, and the film contains a variety of grain orientations.

In published articles ("Orientation Selection by Zone-Melting Silicon Films Through Planar Constrictions", Appl. Phys. Lett. 41, 747 (1982); "Solidification Front Modulation to Entrain Subboundaries in Zone Melting Recrystallization of Si on $SiO_2$", J. Electrochem. Soc. 130, 1178 (1983), by M. W. Geis, H. I. Smith, D. J. Silversmith, R. W. Mountain and C. V. Thompson) and in earlier patent applications ("Entraining Crystalline Boundaries", M. W. Geis, H. I. Smith, U.S. Ser. No. 391,130, filed June 23, 1982 now U.S. Pat. No. 4,479,846; "Orientation Filtering of Crystalline Films", H. I. Smith. C. V. Thompson, H. A. Atwater, M. W. Geis, U.S. Ser. No. 481,096, filed Mar. 31, 1983) we have described methods for selecting a single grain orientation, predetermining the azimuthal orientation of a thin film (i.e., filtering), and entraining crystalline boundaries and defects. These articles and commonly assigned applications are incorporated herein by reference although the various improvements to the crystallographic quality of films taught by these references apply generally to thin films.

In the above-referenced *Applied Physic Letters* article entitled "Orientation Selection . . . " a method for selecting a single grain orientation is disclosed whereby a molten zone is passed through a narrow, planar constriction or "neck" patterned into a semiconductor film. When the film recrystallizes, a single grain orientation is selected as the solidification front passes through the neck.

In the above-referenced article from the *Journal of the Electrochemical Society* entitled "Solidification Front Modulation . . . ", a method for entraining grain boundaries and subboundaries is disclosed whereby photolithographically defined patterns are employed to modulate the solidification front during zone melting. This can be done by forming a grating on top of the semiconductor film which locally enhances either the absorption or reflection of the radiation incident from above. U.S. Pat. No. 4,479,846 issued to two of the present applicants describes and claims this entrainment technique. One of the objects of this invention is to provide a means whereby techniques that improve the crystallographic quality of thin films can be applied to thick films.

It is a further object of this invention to provide a means for establishing a specific crystallographic texture in a thick film on a foreign substrate.

It is a further object of this invention to provide a means for establishing a single orientation in a thick film on a foreign substrate.

It is a further object of this invention to provide a means for establishing a specific crystallographic orientation in a thick film on a foreign substrate.

SUMMARY OF THE INVENTION

According to this invention a thick film to be recrystallized on a foreign substrate is formed in such a way that one or more sections of the film are made thin, thereby forming a vertical constriction. Recrystallization is initiated in the thin section of the film such that the desired crystallographic texture is established there. The recrystallization process is then extended into the thick section of the film such that the desired crystallographic characteristics are given to the thick film. The planar constriction technique (so-called hourglass technique) referenced above, can be applied in the thin section of the film to establish a single-grain orientation. The orientation filtering technique, referenced above, can be applied in the thin section of the film to select a specific orientation, or to select a range of crystallographic orientations, or to select a limited number of discrete orientations.

BRIEF DESCRIPTION OF THE DRAWINGS

Numerous other features, objects and advantages of the invention will become apparent from the following specifications when read in conjunction with the accompanying drawings in which.

DESCRIPTION OF THE PREFERRED EMBODIMENTS

Figure 1:
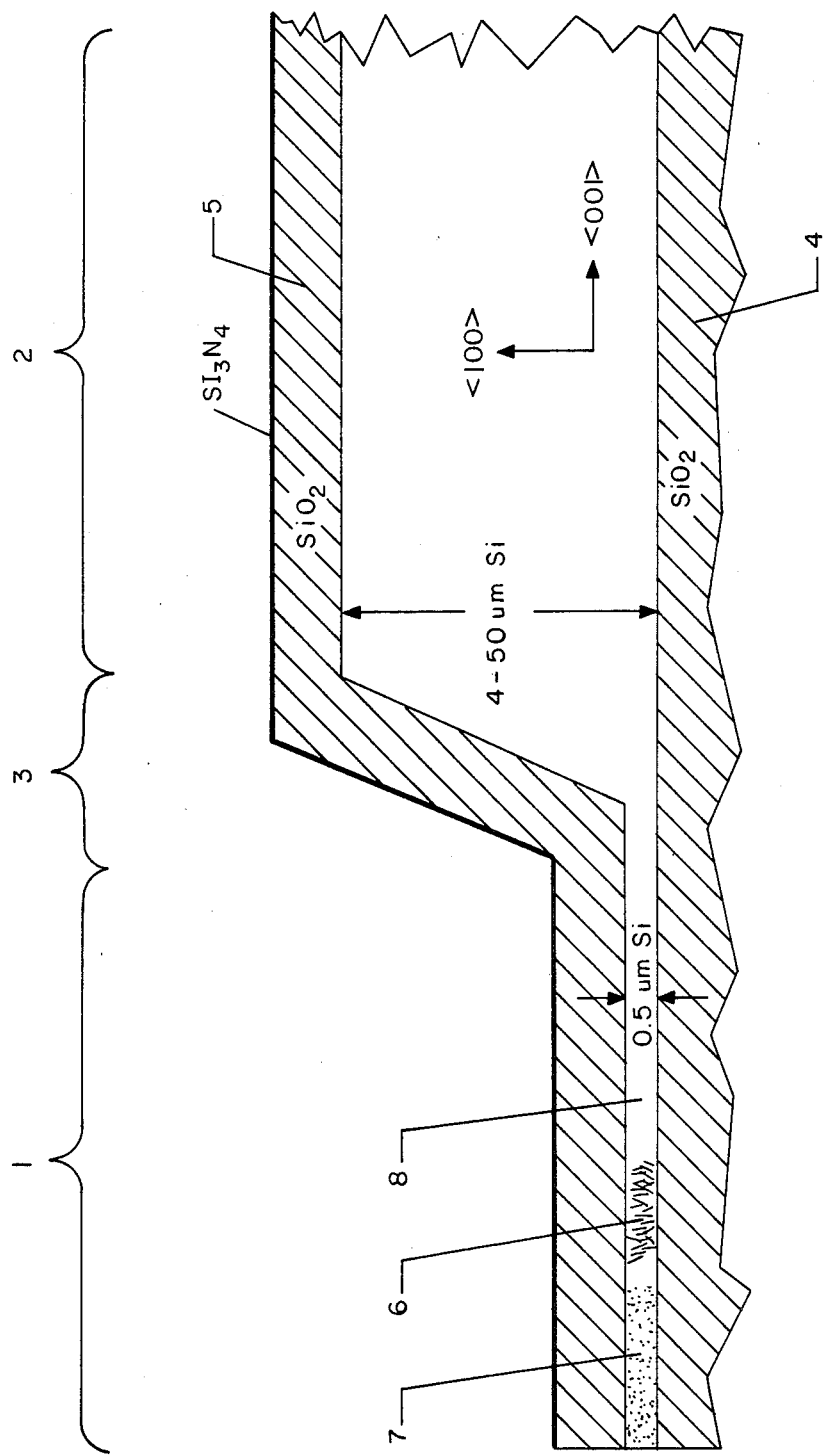
FIG. 1 is a cross-sectional view of a sample prepared with a vertical constriction or thinned section.

With reference now to the drawings, there is shown in FIG. 1 a cross-sectional view of a sample prepared for ZMR consisting of a thin section 1, a much thicker section 2 and a tapered section 3, in between. The substrate 4 is coated with fine-grain polycrystalline Si by a chemical vapor deposition (CVD) process. In our experiments the substrate was thermal $SiO_2$ on a Si wafer. Clearly, other substrates are also feasible. Silicon was deposited to a thickness of about 50 $\mu$m, as indicated. Chemical etching produced the thinned section 1, as well as the tapered region 3. The thin section 1 is typically about 0.5 $\mu$m to 1 $\mu$m thick, as indicated. After thinning, the entire sample was covered with a composite encapsulation layer 5 consisting of 2 $\mu$m of CVD-deposited $SiO_2$ and 40 nm of sputtered $Si_3N_4$.

ZMR is begun in the thin section 1, extended through the tapered region 3, and into the thick section 2. The transition region 6 marks the start of the recrystallization, that is, the transition between the fine-grain polycrystalline starting material 7 and the very large grain recrystallized material 8 in the thin section to the right of the transition region. As discussed above, and in the cited references, the recrystallized material is characterized by a predominance (100) texture, large grains of the order of 1 mm wide, and a strong tendency for (100)-textured grains to have their <100> direction within about ±20° of the scanning direction. Our experiments have demonstrated that the grain orientation is maintained as the film thickness is increased through the tapered section 3 and into the thick section 2. Thus, the orientation that is established in the thin section can be extended into the thick material.

Figure 2:
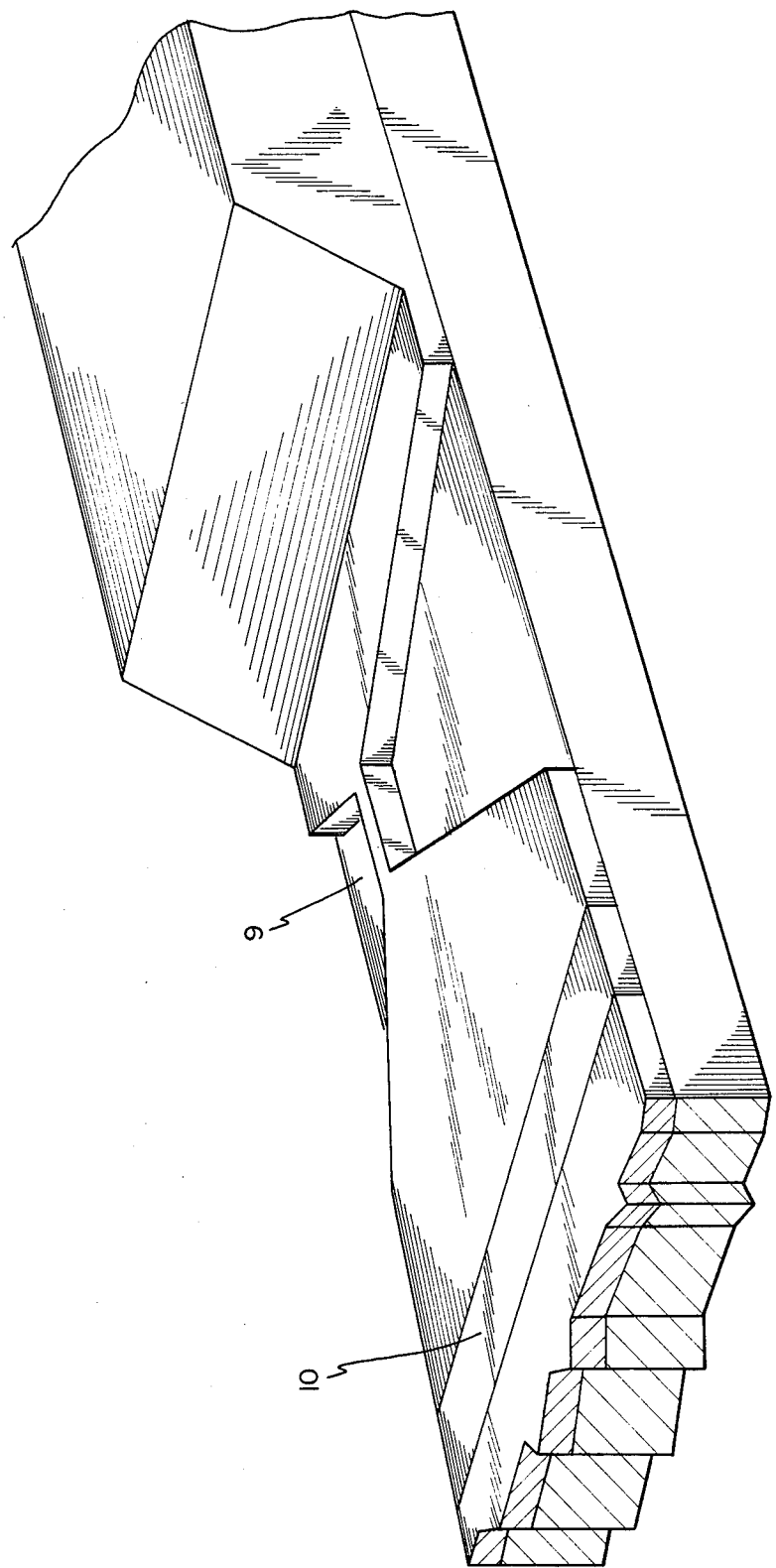
FIG. 2 is a perspective view of planar constriction and orientation filter patterns located in a thin section of a film adjacent to a thick section.

FIG. 2 illustrates how a single crystal of predetermined orientation can be established in the thick section 2. In the thin section a planar constriction pattern is formed. The narrow constriction 9 will allow only a single orientation to extend through it toward the right. With further ZMR, this same orientation can be extended through the tapered section and into the thick section. The orientation filter 10 will select out a specific orientation or a range of orientations prior to entry into the constriction 9. In some cases it may be desirable to locate the transition region within the filter pattern.

There has been described novel apparatus and techniques for control of crystallographic orientation in thick films. It is evident that various changes and modifications can be made by those skilled in the art without departing from the spirit and scope of our claims. Although silicon is described herein as the crystalline material, various other materials, such as Ge, GaAs, InP, GaAlAs, InSb, CdTe, and, generally crystals of III-V and II-VI compounds, among others may be employed. Although the discussion herein has been primarily concerned with methods that produce the <100> orientation in the plane of the film, roughly parallel to the direction of zone motion, it should be clear that other orientations and textures can be achieved with our technique. The sequence of filtering (orientation, planar and vertical) can be varied to produce desired results. Moreover, other recrystallization techniques can be substituted for the specific ZMR method described herein. Heating may be accomplished by a radiant strip heater, a scanning laser or an electron beam device, for examples. Finally, the range of initial thicknesses to produce optimal results will vary with the ultimate thickness desired and the materials used; the initial thickness for each case can be determined without undue experimentation.

We claim:

1. A method of forming a thick crystalline film with large, uniform-textured, grains and aligned crystallographic orientations upon a substrate, the method comprising:
    (a) depositing a film to be processed upon the surface of the substrate;
    (b) establishing a pattern of vertical constriction in a portion of the film; the pattern being characterized by a thin section and a section of graduated thickness connecting the thin section to the rest of the deposited film; and
    (c) heating the film sequentially from the thin section to the rest of the film to induce recrystallization, whereby the orientation of the thin section will be passed on to the bulk of the deposited film.

2. The method of claim 1 wherein the step of depositing the film further comprises depositing the film by chemical vapor deposition.

3. The method of claim 1 wheren the step of establishing the pattern in the film further comprises photolithographically etching a pattern in the film.

4. The method of claim 1 wherein the step of heating the film sequentially further comprises passing a heated zone through the film.

5. The method of claim 1 wherein the method further comprises covering the film with an encapsulation layer after the vertical constriction pattern is established.

6. The method of claim 1 wherein the method further comprises establishing a planar constriction pattern, as well as a vertical constriction pattern, in the thin section prior to heating.

* * * * *